United States Patent
Davis et al.

(10) Patent No.: US 10,268,548 B2
(45) Date of Patent: Apr. 23, 2019

(54) FAILURE MAPPING IN A STORAGE ARRAY

(71) Applicant: PURE STORAGE, INC., Mountain View, CA (US)

(72) Inventors: John D. Davis, Mountain View, CA (US); John Hayes, Mountain View, CA (US); Hari Kannan, Mountain View, CA (US); Nenad Miladinovic, Mountain View, CA (US); Zhangxi Tan, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 107 days.

(21) Appl. No.: 15/418,333

(22) Filed: Jan. 27, 2017

(65) Prior Publication Data

US 2017/0139776 A1 May 18, 2017

Related U.S. Application Data

(63) Continuation of application No. 14/454,516, filed on Aug. 7, 2014, now Pat. No. 9,558,069.

(51) Int. Cl.
*G06F 11/00* (2006.01)
*G06F 11/14* (2006.01)
(Continued)

(52) U.S. Cl.
CPC ........ *G06F 11/1423* (2013.01); *G06F 11/108* (2013.01); *G06F 11/142* (2013.01);
(Continued)

(58) Field of Classification Search
CPC .. G06F 11/004; G06F 11/076; G06F 11/1008; G06F 11/1068; G06F 11/1423; G06F 11/1666; G06F 11/2094
See application file for complete search history.

(56) References Cited

U.S. PATENT DOCUMENTS 6,725,392 B1 4/2004 Frey et al.
6,845,045 B1 1/2005 Cernea
(Continued)

FOREIGN PATENT DOCUMENTS

WO 2008103569 A1 8/2008
WO 2012044489 A1 4/2012
WO 2013030217 A1 3/2013

OTHER PUBLICATIONS

Savill, John; Introduction to Cluster Shared Volumes, Aug. 14, 2011. http://windowsitpro.com/high-availability/introduction-cluster-shared-volumes.
(Continued)

*Primary Examiner* — Charles Ehne
(74) *Attorney, Agent, or Firm* — Womble Bond Dickinson (US) LLP

(57) ABSTRACT

A storage cluster is provided. The storage cluster includes a plurality of storage nodes within a chassis. The plurality of storage nodes has flash memory for storage of user data and is configured to distribute the user data and metadata throughout the plurality of storage nodes such that the storage nodes can access the user data with a failure of two of the plurality of storage nodes. Each of the storage nodes is configured to generate at least one address translation table that maps around defects in the flash memory on one of a per flash package basis, per flash die basis, per flash plane basis, per flash block basis, per flash page basis, or per physical address basis. Each of the plurality of storage nodes is configured to apply the at least one address translation table to write and read accesses of the user data.

17 Claims, 9 Drawing Sheets

(51) Int. Cl.

| | | |
|---|---|---|
| *G06F 11/16* | (2006.01) | |
| *G11C 29/00* | (2006.01) | |
| *G06F 11/10* | (2006.01) | |
| *G06F 12/1009* | (2016.01) | |
| *G11C 29/36* | (2006.01) | |
| *G11C 29/38* | (2006.01) | |
| *G11C 29/44* | (2006.01) | |

(52) U.S. Cl.
CPC ...... *G06F 11/1666* (2013.01); *G06F 12/1009* (2013.01); *G11C 29/00* (2013.01); *G11C 29/76* (2013.01); *G11C 29/765* (2013.01); *G06F 11/1004* (2013.01); *G06F 11/1012* (2013.01); *G06F 11/1068* (2013.01); *G06F 2201/805* (2013.01); *G06F 2201/82* (2013.01); *G06F 2212/1032* (2013.01); *G06F 2212/202* (2013.01); *G06F 2212/466* (2013.01); *G06F 2212/7206* (2013.01); *G11C 29/36* (2013.01); *G11C 29/38* (2013.01); *G11C 29/44* (2013.01)

(56) References Cited

U.S. PATENT DOCUMENTS

| | | | |
|---|---|---|---|
| 6,952,794 B2 | 10/2005 | Lu | |
| 6,961,890 B2 | 11/2005 | Smith | |
| 7,151,694 B2 | 12/2006 | Meihong et al. | |
| 7,167,878 B2 | 1/2007 | Chan | |
| 7,266,747 B2 | 9/2007 | Foss | |
| 7,472,331 B2 | 12/2008 | Kim | |
| 7,509,645 B2 | 3/2009 | Coates et al. | |
| 7,640,452 B2 | 12/2009 | Chen et al. | |
| 7,778,960 B1 | 8/2010 | Chatterjee et al. | |
| 7,869,383 B2 | 1/2011 | Tabbara et al. | |
| 7,908,448 B1 | 3/2011 | Chatterjee et al. | |
| 8,010,485 B1 | 8/2011 | Chatterjee et al. | |
| 8,010,829 B1 | 8/2011 | Chatterjee et al. | |
| 8,046,548 B1 | 10/2011 | Chatterjee et al. | |
| 8,051,361 B2 | 11/2011 | Sim-Tang et al. | |
| 8,065,573 B2 | 11/2011 | Abts et al. | |
| 8,081,512 B2 | 12/2011 | Ueno et al. | |
| 8,086,911 B1 | 12/2011 | Taylor | |
| 8,103,904 B2 | 1/2012 | Hafner et al. | |
| 8,145,838 B1 | 3/2012 | Miller et al. | |
| 8,156,392 B2 | 4/2012 | Flynn et al. | |
| 8,195,688 B1 | 6/2012 | Sawhney et al. | |
| 8,244,999 B1 | 8/2012 | Chatterjee et al. | |
| 8,281,023 B2 | 10/2012 | Dondeti et al. | |
| 8,296,625 B2 | 10/2012 | Diggs et al. | |
| 8,327,080 B1 | 12/2012 | Der | |
| 8,429,492 B2 | 4/2013 | Yoon et al. | |
| 8,458,287 B2 | 6/2013 | Ozzie et al. | |
| 8,473,778 B2 | 6/2013 | Simitci et al. | |
| 8,479,037 B1 | 7/2013 | Chatterjee et al. | |
| 8,498,967 B1 | 7/2013 | Chatterjee et al. | |
| 8,520,461 B2 | 8/2013 | Lee | |
| 8,522,073 B2 | 8/2013 | Cohen | |
| 8,560,922 B2 | 10/2013 | Bivins et al. | |
| 8,589,761 B2 | 11/2013 | Cronin et al. | |
| 8,595,455 B2 | 11/2013 | Chatterjee et al. | |
| 8,621,291 B2 | 12/2013 | Kinoshita | |
| 8,627,136 B2 | 1/2014 | Shankar et al. | |
| 8,683,277 B1 | 3/2014 | Vamica et al. | |
| 8,700,875 B1 | 4/2014 | Barron et al. | |
| 8,706,962 B2 | 4/2014 | Belluomini et al. | |
| 8,760,922 B2 | 6/2014 | Lassa | |
| 8,775,868 B2 | 7/2014 | Colgrove et al. | |
| 8,775,901 B2 | 7/2014 | Sharon et al. | |
| 8,799,746 B2 | 8/2014 | Baker et al. | |
| 8,843,447 B2 | 9/2014 | Molaro et al. | |
| 8,850,108 B1 | 9/2014 | Hayes et al. | |
| 8,856,431 B2 | 10/2014 | Chen | |
| 8,856,593 B2 | 10/2014 | Eckhardt et al. | |
| 8,892,980 B2 | 11/2014 | Fillingim | |
| 8,904,123 B2 | 12/2014 | Crawford et al. | |
| 8,959,416 B1 | 2/2015 | Malonzo | |
| 8,977,803 B2 | 3/2015 | Horn et al. | |
| 9,009,565 B1 | 4/2015 | Northcott et al. | |
| 9,025,405 B2 | 5/2015 | Jeong | |
| 9,122,699 B2 | 9/2015 | Molaro et al. | |
| 9,214,351 B2 | 12/2015 | Hsiao | |
| 9,220,461 B2 | 12/2015 | Samuelsson | |
| 9,299,455 B2 | 3/2016 | Suzuki et al. | |
| 9,406,390 B2 | 8/2016 | Kim | |
| 9,478,315 B2 | 10/2016 | Yang | |
| 2001/0048625 A1* | 12/2001 | Patti .................... | G06F 11/1008 365/201 |
| 2002/0091965 A1* | 7/2002 | Moshayedi ........... | G06F 11/004 714/6.13 |
| 2002/0161984 A1* | 10/2002 | Lloyd-Jones ....... | G06F 12/0238 711/203 |
| 2002/0172074 A1 | 11/2002 | Hsu et al. | |
| 2006/0236056 A1 | 10/2006 | Nagata | |
| 2007/0268905 A1 | 11/2007 | Baker et al. | |
| 2008/0117548 A1 | 5/2008 | Azuma et al. | |
| 2008/0295118 A1 | 11/2008 | Liao | |
| 2010/0162084 A1* | 6/2010 | Coulson .............. | G06F 11/1068 714/773 |
| 2010/0251044 A1* | 9/2010 | Khatri ................. | G06F 11/1666 714/723 |
| 2010/0251077 A1 | 9/2010 | Kim et al. | |
| 2010/0268908 A1 | 10/2010 | Ouyang et al. | |
| 2010/0287335 A1 | 11/2010 | Chung et al. | |
| 2011/0113075 A1 | 5/2011 | Fukushima | |
| 2011/0307758 A1 | 12/2011 | Fillingim | |
| 2012/0066473 A1 | 3/2012 | Tremaine et al. | |
| 2012/0166749 A1 | 6/2012 | Eleftheriou et al. | |
| 2012/0239853 A1 | 9/2012 | Moshayedi | |
| 2012/0239990 A1 | 9/2012 | Mataya et al. | |
| 2012/0272036 A1 | 10/2012 | Muralimanohar | |
| 2012/0278511 A1 | 11/2012 | Alatorre et al. | |
| 2012/0311557 A1 | 12/2012 | Resch | |
| 2013/0046920 A1 | 2/2013 | Ryu et al. | |
| 2013/0060884 A1 | 3/2013 | Bembo et al. | |
| 2013/0117636 A1 | 5/2013 | Kim et al. | |
| 2013/0132638 A1 | 5/2013 | Horn et al. | |
| 2013/0173844 A1 | 7/2013 | Chen et al. | |
| 2013/0198445 A1 | 8/2013 | Bando et al. | |
| 2013/0205183 A1 | 8/2013 | Fillingim | |
| 2013/0232289 A1 | 9/2013 | Zhong et al. | |
| 2013/0238836 A1 | 9/2013 | Suzuki et al. | |
| 2014/0006733 A1 | 1/2014 | Seo et al. | |
| 2014/0047263 A1 | 2/2014 | Coatney et al. | |
| 2014/0092683 A1 | 4/2014 | Hyun et al. | |
| 2014/0136880 A1 | 5/2014 | Shankar et al. | |
| 2014/0136927 A1 | 5/2014 | Li et al. | |
| 2014/0189421 A1 | 7/2014 | Werner et al. | |
| 2014/0195558 A1 | 7/2014 | Murthy et al. | |
| 2015/0052416 A1 | 2/2015 | Prohofsky et al. | |
| 2016/0041869 A1* | 2/2016 | Davis ................. | H03M 13/3761 714/773 |
| 2017/0255512 A1* | 9/2017 | Zamir ................. | G06F 11/1068 |

OTHER PUBLICATIONS

Xiao Qin et al.; "Measuring and Analyzing Write Amplification Characteristics of Solid State Disks"; Modeling, Analysis & Simulation of Computer and Telecommunication Systems (MASCOTS), 2013 IEEE 21st International Symposium on Aug. 2013. (http://www.researchgate.net/publication/262362154). See pp. 1-10.

Storer, Mark W., Greenan, Kevin M., Miller L. Ethan, Voruganti, Kaladhar; Pergamum: Replacing Tape with Energy Efficient, Reliable, Disk-Based Archival Storage.

Hwang, Kai, Jin, Hair, Ho, Roy; RAID-x: A New Distributed Disk Array for I/O-Centric Cluster Computing.

Hwang, Kai, Jin, Hai, Ho, Roy; RAID-x: A New Distributed Disk Array for I/O-Centric Cluster Computing.

\* cited by examiner

FAILURE MAPPING IN A STORAGE ARRAY

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have operation, lifespan, defect and other characteristics that differ from spinning media. Yet, many solid-state drives are designed to conform to hard disk drive standards for compatibility reasons, which makes it difficult to provide enhanced features or take advantage of unique aspects of flash and other solid-state memory. In addition, address spaces optimized for spinning media may be suboptimal for solid-state memory.

It is within this context that the embodiments arise.

SUMMARY

In some embodiments, a storage cluster is provided. The storage cluster includes a plurality of storage nodes within a chassis. Each of the plurality of storage nodes has flash memory for storage of user data, the plurality of storage nodes configured to distribute the user data and metadata associated with the user data throughout the plurality of storage nodes such that the plurality of storage nodes can access the user data, via erasure coding, with a failure of two of the plurality of storage nodes. Each of the plurality of storage nodes is configured to generate at least one address translation table that maps around defects in the flash memory on one of a per flash package basis, per flash die basis, per flash plane basis, per flash block basis, per flash page basis, or per physical address basis. Each of the plurality of storage nodes is configured to apply the at least one address translation table to write and read accesses of the user data.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
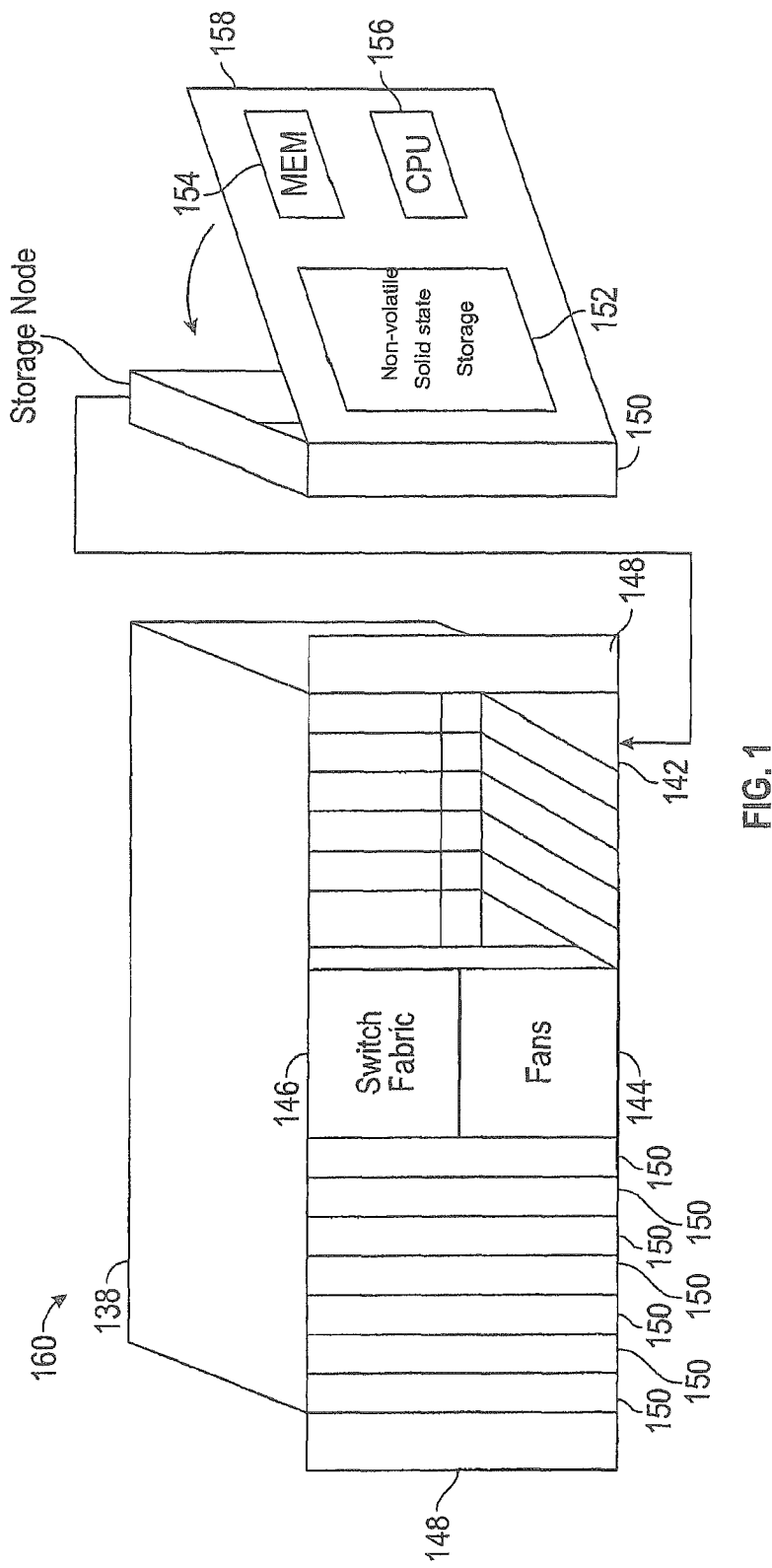
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection in which data is broken into fragments, expanded and encoded with redundant data pieces and stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of the power distribution and the internal and external communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid-state memory units, which may be referred to as non-volatile solid-state storages or storage units. One embodiment includes a single storage server in each storage node and between one to eight non-volatile solid-state memory units, however this one example is not meant to be limiting. The storage server may include a processor, dynamic random access memory (DRAM) and interfaces for the internal communication bus and power distribution for each of the power buses. Inside the storage node, the interfaces and non-volatile solid-state storage share a communication bus, e.g., PCI Express, in some embodiments. The non-volatile solid-state memory units may directly access the internal communication bus interface through a storage node communication bus, or request the storage node to access the bus interface. The non-volatile solid-state memory unit contains an embedded central processing unit (CPU), solid-state storage controller, and a quantity of solid-state mass storage, e.g., between 2-32 terabytes (TB) in some embodiments. An embedded volatile storage medium, such as DRAM, and an energy reserve apparatus are included in the non-volatile solid-state memory unit. In some embodiments, the energy reserve apparatus is a capacitor, super-capacitor, or battery that enables transferring a subset of DRAM contents to a stable storage medium in the case of power loss. In some embodiments, the non-volatile solid-state memory unit is constructed with a storage class memory, such as phase change or other resistive random access memory (RRAM) or magnetoresistive random access memory (MRAM) that substitutes for DRAM and enables a reduced power hold-up apparatus.

The storage nodes have one or more non-volatile solid-state storage units, each of which has non-volatile random-access memory (NVRAM) and flash memory, in some embodiments. The non-volatile solid-state storage units apply various address spaces for storing user data. The address spaces, and assignments of addresses to data segments and data shards, may be tracked in mapping tables, which are implemented as metadata in various locations in memory. In some embodiments, an address space has sequential, nonrepeating addresses, as applied to medium addresses, segment addresses and/or virtual allocation units of the user data. In various embodiments, the address space can be ever-increasing, ever-decreasing or some other nonrepeating sequence of values. For simplicity, the ever-increasing, nonrepeating addresses may be used as one example in the embodiments but is not meant to be limiting. This mechanism enhances the ability to write to pages in flash memory, and for reading the flash memory to recover a previous version of user data. In a storage cluster, the non-volatile solid-state storage units are assigned non-overlapping ranges from this address space.

One of many features of the storage nodes and non-volatile solid-state storages disclosed herein is the ability to perform failure mapping with flash memory on a per package, die, plane, block, page or individual address basis. The storage nodes and non-volatile solid-state storage units map around defects in the flash memory. Allowing continued use of flash dies with defective blocks or pages, and flash packages with defective flash dies, supports yield recovery, use of all available storage space, and virtualizing the capacity of the system. Die packages that could not ordinarily be sold in the marketplace can be used. The failure mapping can be performed dynamically, which supports graceful degradation of storage capacity without catastrophic failure.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a single chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid-state storage 152 coupled to the CPU 156, although other mountings and/or components could be used in further embodiments. The memory 154 has instructions which are executed by the CPU 156 and/or data operated on by the CPU 156. As further explained below, the non-volatile solid-state storage 152 includes flash or, in further embodiments, other types of solid-state memory.

Storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid-state storage units 152 or storage nodes 150 within the chassis.

Figure 2:
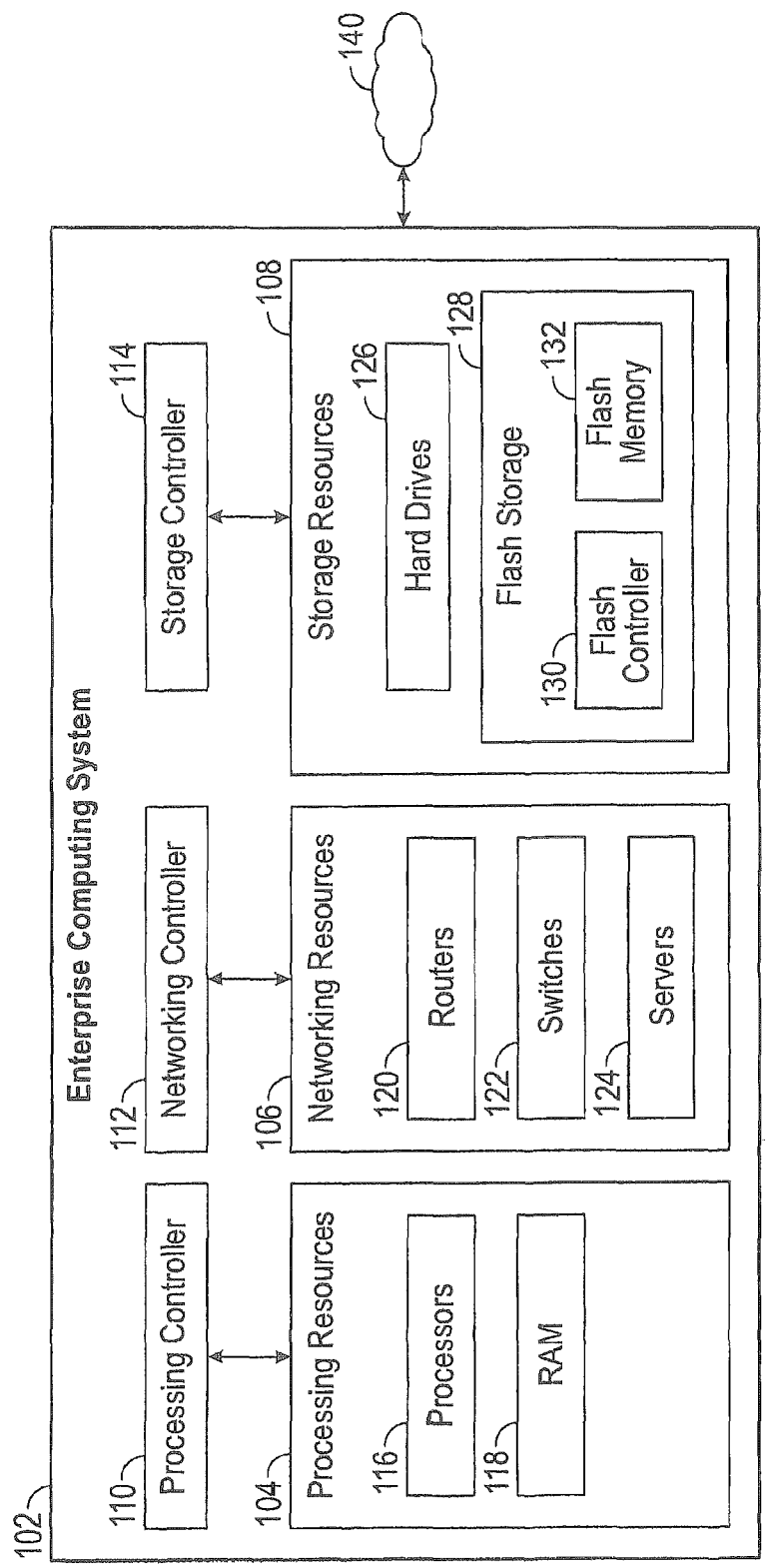
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid-state storage of FIG. 1 as a storage resource 108. For example, flash storage 128 of FIG. 2 may integrate the storage nodes, storage clusters and/or non-volatile solid-state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid-state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid-state storage could be individually configured with a respective amount of storage space, which is then reconfigurable independently of the others. Storage capacity can thus be flexibly added, upgraded, subtracted, recovered and/or reconfigured at each of the non-volatile solid-state storages. As mentioned previously, each storage node could implement one or more servers in some embodiments.

Figure 3:
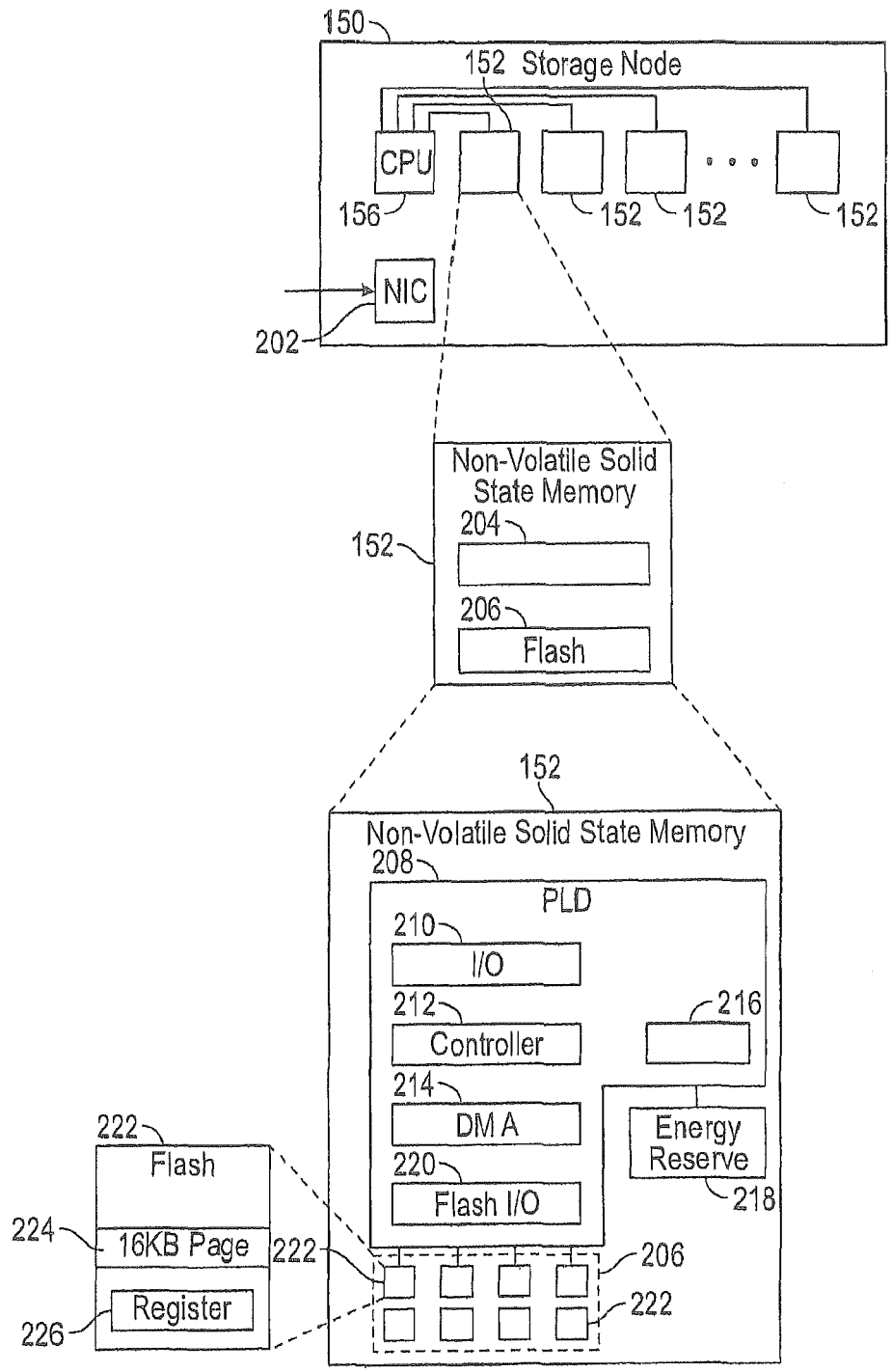
FIG. 3 is a multiple level block diagram, showing contents of a storage node and contents of one of the non-volatile solid-state storage units in accordance with some embodiments.

FIG. 3 is a multiple level block diagram, showing contents of a storage node 150 and contents of a non-volatile solid-state storage 152 of the storage node 150. Data is communicated to and from the storage node 150 by a network interface controller (NIC) 202 in some embodiments. Each storage node 150 has a CPU 156, and one or more non-volatile solid-state storage 152, as discussed above. Moving down one level in FIG. 3, each non-volatile solid-state storage 152 has a relatively fast non-volatile solid-state memory, such as non-volatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as dies on a printed circuit board or other substrate. In some embodiments, the hybrid package may include a combination of memory types, such as NVRAM, random access memory (RAM), CPU, field programmable gate array (FPGA), or different sized flash memory in the same package. In the embodiment shown, the non-volatile solid-state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

In NVRAM 204, redundancy is not organized by segments but instead by messages, where each message (e.g., 128 bytes to 128 kB or smaller or larger) establishes its own data stripe, in some embodiments. NVRAM is maintained at the same redundancy as segment storage and operates within the same storage node groups in some embodiments. Because messages are stored individually the stripe width is determined both by message size and the storage cluster configuration. Larger messages may be more efficiently stored as wider strips.

Two of the many tasks of the CPU 156 on a storage node 150 are to break up write data, and reassemble read data. When the system has determined that data is to be written, an authority for that data is located in one of the non-volatile solid-state storages 152. The authority, i.e., the owner of the metadata or user data, may be embodied as metadata, including one or more lists such as lists of data segments which the non-volatile solid-state storage 152 manages. When a segment ID for data is already determined the request to write is forwarded to the non-volatile solid-state storage 152 currently determined to be the host of the authority determined from the segment. The host CPU 156 of the storage node 150, on which the non-volatile solid-state storage 152 and corresponding authority reside, then breaks up or shards the data and transmits the data out to various non-volatile solid-state storage 152. The transmitted data is written as a data stripe in accordance with an erasure coding scheme. In some embodiments, data is requested to be pulled, and in other embodiments, data is pushed. In reverse, when data is read, the authority for the segment ID containing the data is located as described above. The host CPU 156 of the storage node 150 on which the non-volatile solid-state storage 152 and corresponding authority reside requests the data from the non-volatile solid-state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid-state storage 152. In some embodiments, the segment host requests the data be sent to storage node 150 by requesting pages from storage and then sending the data to the storage node making the original request. In some embodiments, a stripe width is only read if there is a single page grid failure or delay.

In some systems, for example in UNIX-style file systems, data is handled with an index node or Mode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment may be an address space between medium address space and physical flash locations. Segments may also contain metadata, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid-state storages 152 coupled to the host CPUs 156 in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (filenames), which link to an Mode ID. Inodes point into medium address space, where data is logically stored. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid-state storage 152 may be assigned a range of address space. Within this assigned range, the non-volatile solid-state storage 152 is able to allocate addresses without synchronization with other non-volatile solid-state storage 152.

Data and metadata are stored by a set of underlying storage layouts that are optimized for varying workload patterns and storage devices. These layouts incorporate multiple redundancy schemes, compression formats and index algorithms Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Data is not further replicated within a storage cluster, as it is assumed a storage cluster may fail. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

Figure 4:
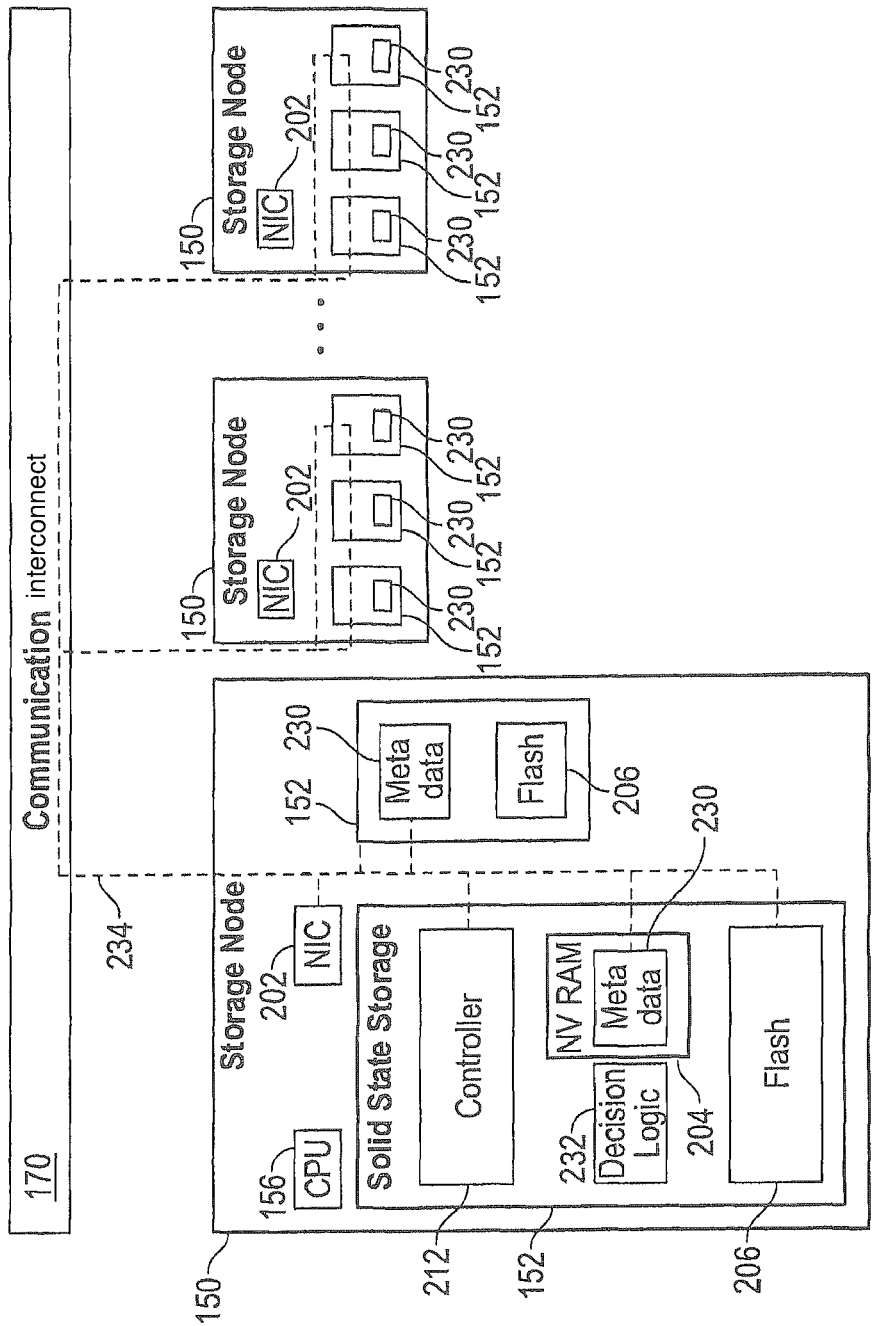
FIG. 4 is a block diagram showing a communication path for redundant copies of metadata, with further details of storage nodes and solid-state storages in accordance with some embodiments.

FIG. 4 is a block diagram showing a communication path 234 for redundant copies of metadata 230, with further details of flash storage nodes 150 (i.e., storage nodes 150 having flash memory) and non-volatile solid-state storages 152 in accordance with some embodiments. Metadata 230 includes information about the user data that is written to or read from the flash memory 206. Metadata 230 can include messages, or derivations from the messages, indicating actions to be taken or actions that have taken place involving the data that is written to or read from the flash memory 206. Distributing redundant copies of metadata 230 to the non-volatile solid-state storage units 152 through the communication interconnect 170 ensures that messages are persisted and can survive various types of failure the system may experience. Each non-volatile solid-state storage 152 dedicates a portion of the NVRAM 204 to storing metadata 230. In some embodiments, redundant copies of metadata 230 are stored in the additional non-volatile solid-state storage 152.

Flash storage nodes 150 are coupled via the communication interconnect 170. More specifically, the network interface controller 202 of each storage node 150 in the storage cluster is coupled to the communication interconnect 170, providing a communication path 234 among storage nodes 150 and non-volatile solid-state storage 152. Storage nodes 150 have one or more non-volatile solid-state storage units 152. Non-volatile solid-state storage units 152 internal to a storage node can communicate with each other, for example via a bus, a serial communication path, a network path or other communication path 234 as readily devised in accordance with the embodiments disclosed herein. Communication interconnect 170 can be included in or implemented with the switch fabric of FIG. 1 in some embodiments. Storage nodes 150 of FIG. 4 form a storage cluster that is enclosed within a single chassis that has an internal power distribution bus within the chassis as described with reference to FIG. 1.

Referring to FIGS. 3 and 4, in case of a power failure, whether local to non-volatile solid-state storage 152 or a storage node 150, data can be copied from the NVRAM 204 to the flash memory 206. For example, the DMA unit 214 of FIG. 3 can copy contents of the NVRAM 204, including the metadata, to the flash memory 206, using power supplied by the energy reserve 218. Energy reserve 218 is sized with sufficient capacity to support copy operation. That is, the energy reserve 218 should be sized so as to provide sufficient current at a sufficient voltage level for a time duration long enough to complete the copying so that messages that are in metadata 230 are persisted in the flash memory 206.

A further mechanism for persisting messages in a storage system involves the communication path 234 described above in FIG. 4. Redundant copies of the metadata 230 can be distributed via the communication path 234, in various ways. For example, a message coming from the filesystem could be distributed via the communication interconnect 170 as a broadcast over the communication path 234 to all of the non-volatile solid-state storages 152. A non-volatile solid-state storage 152 could send a copy of metadata 230 over the communication path 234 to other non-volatile solid-state storage 152 in a storage node 150. CPU 156 on a storage node 150, receiving a message from the communication interconnect 170 via the network interface controller 202 could send a copy of the message to each solid-state storage 152. The CPU 156 may rebroadcast the message to other flash storage nodes 150, and the flash storage nodes 150 could then distribute the message to the solid-state storages 152 in each of these flash storage nodes 150 in some embodiments. In these and other uses of the communication path 234, redundant copies of the metadata 230 can be distributed to the non-volatile solid-state storages 152. Then, if one non-volatile solid-state storage 152, or one storage node 150 experiences a failure, redundant copies of any message are available in metadata 230 of at least one other non-volatile solid-state storage 152. Each non-volatile solid-state storage 152 can apply decision logic 232 when evaluating various situations such as local power failure, an unreachable node, or instructions to consider or commence a data recovery or a data rebuild. The decision logic 232 includes witnessing logic, voting logic, consensus logic and/or other types of decision logic in various embodiments. Decision logic 232 could be implemented in hardware, software executing on the controller 212, firmware, or combinations thereof, and could be implemented as part of the controller 212 or coupled to the controller 212. The decision logic 232 is employed in consensus decisions among multiple solid-state storage units 152, in some embodiments. In further embodiments, the decision logic 232 could cooperate with the other non-volatile solid-state storage units 152 in order to gather copies of the redundant metadata 230, and make local decisions. The mechanisms for persisting messages in a storage system are useful in the event of a failure, and can be used in data recovery and reconstruction as described above.

Examples of messages include a request to write data, a request to read data, a request to lock or unlock a file, a change in permission of a file, an update to a file allocation table or other file or directory structure, a request to write a file that has executable instructions or to write a file name that is reserved and interpreted as an executable direction, updates to one or more authorities, updates to a fingerprint table, list or other data used in deduplication, updates to hash tables, updates to logs, and so on. When a message is received in non-volatile solid-state storage 152 of a storage node 150, indicating some action has taken place, the message or a derivation of the message is stored as metadata 230 in the NVRAM 204 of that solid-state storage 152. By applying the redundant copies of the metadata 230, actions are captured that are in progress, so that if a failure happens, these actions can be replayed and replacement actions can then be performed, for example upon restart. Actions span storage nodes and use cluster messaging, so the act of sending a message can be made persistent data via one or more of the mechanisms for persisting messages. These mechanisms address some of the known failure scenarios in order to ensure availability of data. In some embodiments, the messages don't require permanence beyond completion of the actions. In other embodiments the messages are further retained to facilitate rollback or other recovery operations.

For example, if a command is sent out to carry out a write operation, this message is recorded and redundant. If there is a failure, it can be determined whether or not that action has been carried out, and whether or not the action should be driven to completion. Such determination can be carried out using the decision logic 232 in each non-volatile solid-state storage 152. There is dedicated storage in NVRAM 204 for messages and other metadata 230, so that messages are recorded in the non-volatile solid-state storage 152 and replicated in some embodiments. The messages and other metadata 230 are written into flash memory 206 if one non-volatile solid-state storage 152 experiences a power failure, or if the entire system experiences a power failure or otherwise shuts down. The redundancy level of the messages matches the redundancy level of the metadata in some embodiments. When there are sufficient numbers of copies of messages, the message becomes irrevocable. If one node goes down, other nodes can vote, achieve consensus, or witness the various copies of the message and determine what action, if any, to carry to completion. If the entire system goes down, e.g., through a global power failure, then a sufficient number of these messages get written from NVRAM 204 to flash memory 206. Upon restoration of power, the nodes can again open copies of the message and determine what action, if any, to carry to completion to prevent any corruption.

With continued reference to FIGS. 3 and 4, storage node 150 of a storage cluster 160 includes two levels of controllers. There is a host CPU 156 in the storage node 150, and there is a controller 212 in the non-volatile solid-state storage 152. The controller 212 can be considered a flash memory controller, which serves as a bridge between the host CPU 156 and the flash memory 206. Each of these controllers, namely the host CPU 156 and the flash controller 212, can be implemented as one or more processors or controllers of various types from various manufacturers. The host CPU 156 can access both the flash memory 206 and the NVRAM 204 as distinct resources, with each being independently (i.e., individually) addressable by the host CPU 156.

By separating the NVRAM 204 and the flash memory 206 into distinct resources, not all data placed in the NVRAM 204 must be written to the flash memory 206. The NVRAM 204 can also be employed for various functions and purposes. For example, updates to the NVRAM 204 can be made obsolete by newer updates to the NVRAM 204. A later transfer of user data from the NVRAM 204 to the flash memory 206 can transfer the updated user data, without transferring the obsolete user data to the flash memory 206. This reduces the number of erasure cycles of the flash memory 206, reduces wear on the flash memory 206, and moves data more efficiently. The CPU 156 can write to the NVRAM 204 at a smaller granularity than the granularity of the transfers from the NVRAM 204 to the flash memory 206. For example, the CPU 156 could perform 4 kB writes to the NVRAM 204, and the DMA unit 214 could perform a page write of 16 kB from the NVRAM 204 to the flash memory 206 under direction of the controller 212. The ability to collect multiple writes of user data to the NVRAM 204 prior to writing the user data from the NVRAM 204 to the flash memory 206 increases writing efficiency. In some embodiments, a client write of user data is acknowledged at the point at which the user data is written to the NVRAM 204. Since the energy reserve 218, described above with reference to FIG. 3, provides sufficient power for a transfer of contents of the NVRAM 204 to the flash memory 206, the acknowledgment of the client write does not need to wait until the user data is written to the flash memory 206.

As further examples of differences between present embodiments and previous solid-state drives, the metadata 230 in the NVRAM 204 is not written into the flash memory 206, except in cases of power loss. Here, a portion of the NVRAM 204 acts as a workspace for the CPU 156 of the storage node 150 to apply the metadata 230. The CPU 156 of the storage node 150 can write to the NVRAM 204 and read the NVRAM 204, in order to access the metadata 230. The CPU 156 is responsible for migrating data from the NVRAM 204 down to the flash memory 206 in one embodiment. Transfer from the NVRAM 204 to the flash memory 206 is not automatic and predetermined, in such embodiments. Transfer waits until there is sufficient user data in the NVRAM 204 for a page write to the flash memory 206, as determined by the CPU 156 and directed to the DMA unit 214. The DMA unit 214 can be further involved in the path of the user data. In some embodiments, the DMA unit 214 (also known as a DMA engine) is designed to detect and understand various data formats. The DMA unit 214 can perform a cyclic redundancy check (CRC) calculation to check the integrity of the user data. In some embodiments, the DMA unit 214 inserts the CRC calculation into the data and verifies that the data is consistent with a previously inserted CRC calculation.

Work may be offloaded to the controller 212 of the non-volatile solid-state storage 152. Processing that is offloaded to flash controller 212 can be co-designed with processing performed by the CPU 156 of the storage node 150. Various mapping tables that translate from one address space to another, e.g., index trees or address translation tables, can be managed within the non-volatile solid-state storage 152, in some embodiments. The controller 212 of the non-volatile solid-state storage 152 can perform various tasks such as looking through these mapping tables, finding metadata associated with the mapping tables, and determining physical addresses, e.g., for user data sought by the CPU 156 of the storage node 150. In order to find an authority associated with a segment number, a standard solid-state drive might bring back an entire 16 kB flash page, and the CPU 156 would search in this page. In some embodiments, the controller 212 of the non-volatile solid-state storage 152 can perform this search much more efficiently, and pass the results to the CPU 156 of the storage node 150, without sending back the entire flash page to the CPU 156.

Figure 5:
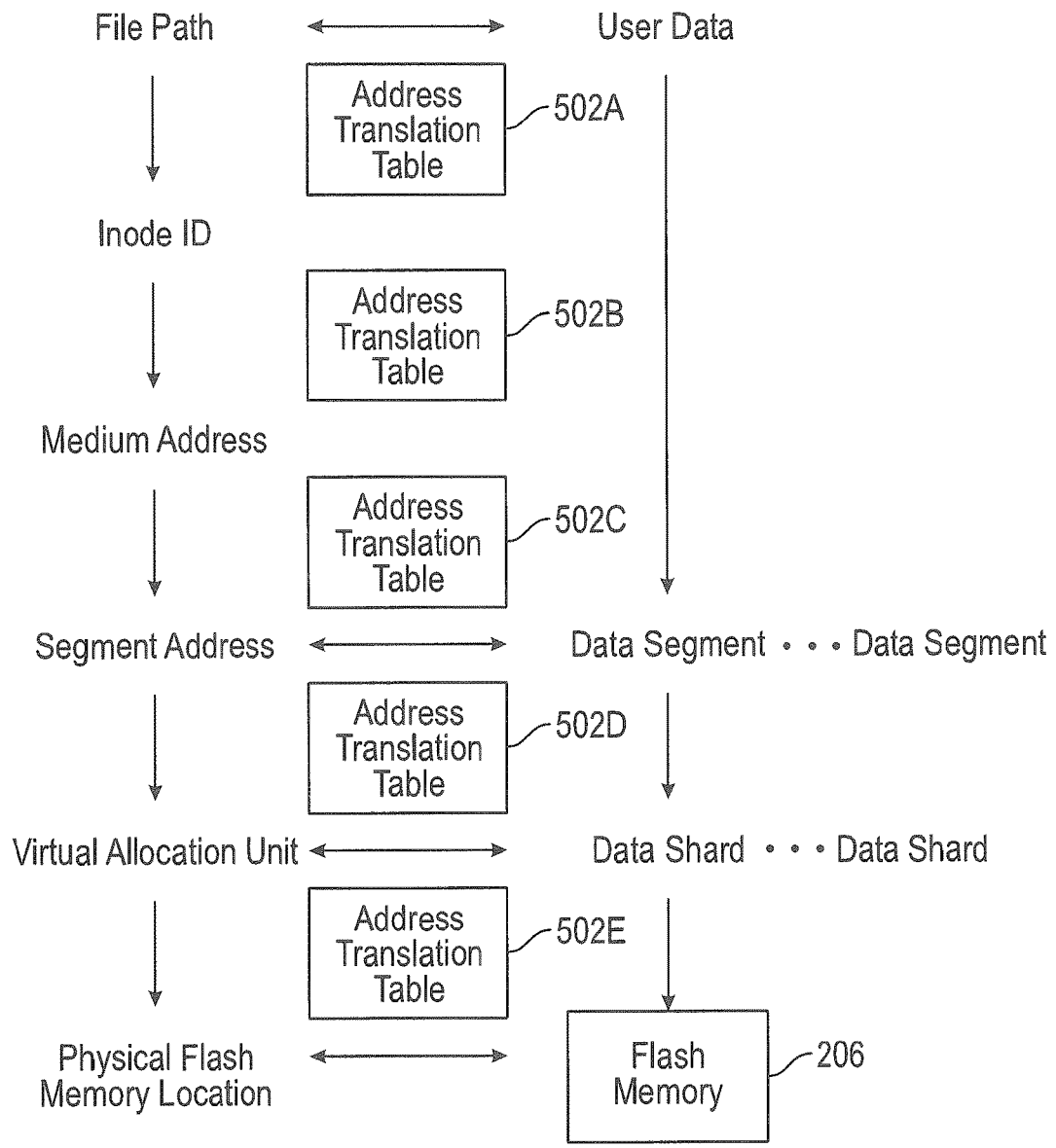
FIG. 5 is an address and data diagram showing address translation as applied to user data being stored in a non-volatile solid-state storage in some embodiments.

FIG. 5 is an address and data diagram showing address translation as applied to user data being stored in an embodiment of a non-volatile solid-state storage 152. In some embodiments, one or more of the address translations applies an address space having sequential, nonrepeating addresses. Addresses in this address space could be in an ever-increasing sequence (e.g., counting numbers or a regular or irregular counting sequence with skipping), an ever-decreasing sequence (e.g., a countdown or a regular or irregular countdown with skipping), a pseudorandom sequence generated from one or more specified or generated seed numbers, a Fibonacci sequence, geometric sequence or other mathematical sequence, etc. Further nonrepeating sequences are readily devised in accordance with the teachings herein. User data, arriving for storage in a storage cluster, is associated with a file path according to a file system. The user data is separated into data segments, each of which is assigned a segment address. Each data segment is separated into data shards, each of which is stored in flash memory 206. Various address translation tables 502 (e.g., mapping tables) are applied by either the CPU of the storage node or the controller of the non-volatile solid-state storage to translate, track and assign addresses to the user data and portions thereof.

These address translation tables 502 reside as metadata in the memory 154 (See FIG. 1) of the storage node, the NVRAM 204 of the non-volatile solid-state storage, and/or the flash memory of the non-volatile solid-state storage, in various embodiments. Generally, address translation tables 502 of FIG. 5 with a greater number of entries as result of being later in the chain of translations (e.g., address translation tables 502D and 502E) should be located in the flash memory 206, as there may not be sufficient memory space for these in the NVRAM or the memory 154. Further, messages regarding updates to the tables 502, or derivations of these messages, could be stored as metadata in the above-described memories. Metadata in one or more of these locations can be subjected to replication, i.e., redundancy, and decisions for various degrees of fault tolerance and system recovery, as described above.

For a particular portion of user data, the file path is translated or mapped to an Mode ID with use of an address translation table 502A. This may be in accordance with a filesystem, and could be performed by the CPU of the storage node in some embodiments. The Mode ID is translated or mapped to a medium address with use of an address translation table 502B, which could be performed by a CPU. In some embodiments, the medium address, which is in a medium address space, is included as one of the sequential, nonrepeating addresses. The medium address is translated or mapped to the segment address, with use of an address translation table 502C through the CPU in some embodiments. The segment address, which is in a segment address space, may be included as one of the sequential, nonrepeating addresses. The segment address, as assigned to the data segment, is translated to a virtual allocation unit, as assigned to the data shard, with use of an address translation table 502D. Controller 212 of the non-volatile solid-state storage may perform this translation by accessing address translation table 502D in the flash memory 206. The virtual allocation unit is translated to a physical flash memory location with the use of an address translation table 502E. The physical flash memory location may be assigned to the data shard in some embodiments.

The address space with the sequential, nonrepeating addresses may be applied to the medium address space, the segment address space and/or the virtual allocation unit address space in various embodiments. In each case, a range of addresses from the address space is assigned to each of the non-volatile solid-state storages in a storage cluster, or to each of the storage nodes in a storage cluster. The ranges may be non-overlapping, such that each non-volatile solid-state storage unit is assigned a range that differs from the ranges of the other non-volatile solid-state storage units. In this mechanism, no address from this address space repeats anywhere in the storage cluster. That is, each address from this address space is unique, and no two portions of user data are assigned the same address from this address space, during the expected lifespan of the system. Each time one of the addresses from this address space is assigned to a portion of user data in a non-volatile solid-state storage unit, whether the address is a medium address, a segment address, or a virtual allocation unit, the address (upon assignment according to the sequence) should be different from all such addresses previously assigned according to the sequence in that non-volatile solid-state storage unit. Thus, the addresses may be referred to as sequential and nonrepeating in this address space. The address space with these properties could include the medium address space, the segment address space and/or the virtual allocation unit address space. A non-volatile solid-state storage unit can allocate the assigned range of addresses in the non-volatile solid-state storage without synchronization with other non-volatile solid-state storage units in a storage cluster in some embodiments.

Each range of the address space has upper and lower bounds in some embodiments. Overall, the address space has a range that exceeds the likely maximum number of addresses from the address space that would be assigned during the expected lifespan of a system. In one embodiment, the sequential, nonrepeating addresses in the address space are binary numbers with at least 128 bits. The amount of bits may vary in embodiments, however with 128 bits, two raised to the $128^{th}$ power is greater than the expected maximum number of addresses occurring for the lifetime of the system. The upper bound of the address space is greater than or equal to this number, or could include or be this number, in some embodiments. Larger numbers could be applied as technology further advances to higher operating speeds and lower time delays for reading and/or writing. The lower bound of the address space could be zero or one, or some other suitable low number, or negative numbers could be used.

Applying the sequential, nonrepeating addresses to one or more of the medium addresses, the segment addresses, or the virtual allocation units, enhance data recovery and flash writes. In some embodiments, the storage cluster, the storage node or the non-volatile, solid-state storage unit performs a snapshot of the present contents of the storage cluster, the storage node, or the non-volatile solid-state storage unit. At a later time, a particular version of user data can be recovered by referring to the snapshot. Since the relevant addresses do not have duplicates, there is an unambiguous record of the version of the user data at the time of the snapshot, and data is readily recovered if still existing in the relevant memory. Formats for snapshots are readily devised, and may include a file with a record of the contents of the cluster, the storage node, or the non-volatile solid-state storage unit, applying one or more address schemes. Depending on which address scheme or schemes is present in the snapshot, the address translation tables 502A, 502B, 502C, 502D, 502E can be applied to determine physical flash memory locations and presence or absence in the flash memory 206 of the desired data for recovery. It should be appreciated that various embodiments can apply various addressing schemes, with various numbers of address translations, various numbers of translation tables, various ranges for the addresses and various names for the addresses. Such address schemes may be developed for various reasons, such as performance, table size reduction, etc.

For flash writes, in some embodiments blocks of flash pages 224 are erased, and then individual flash pages 224 (see FIG. 3) are written in sequential order within a single erased block. This operation is supported by the above-described addressing mechanism, which assigns sequential addresses to data segments and/or data shards as they arrive for storage. In some embodiments, information relating to the medium address, the segment address, and/or the virtual allocation unit is written to a header of the flash page 224, thus identifying data stored in the flash page 224 (e.g., as data shards). The flash page 224, in such embodiments, becomes self-describing and self-checking, via the information in the header.

Figure 6:
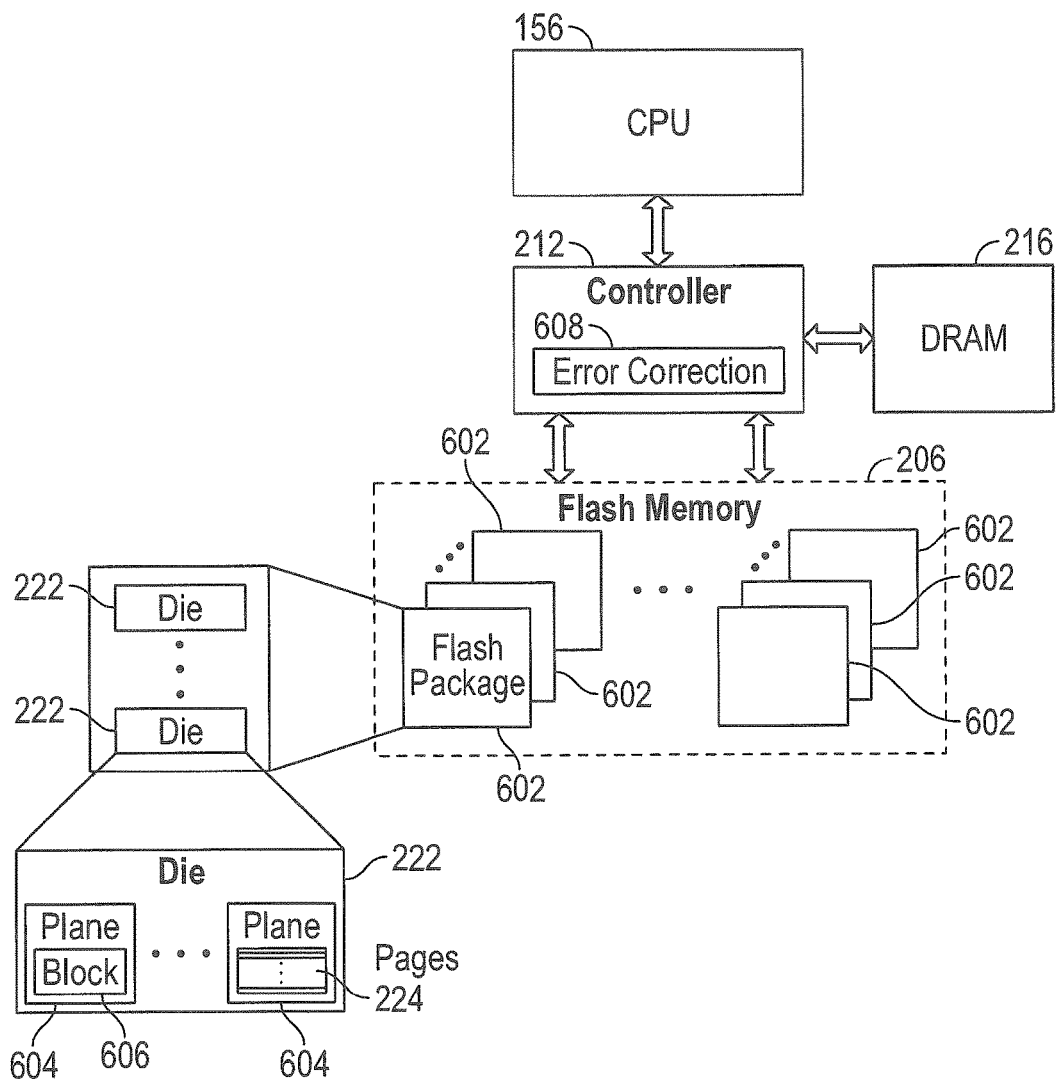
FIG. 6 is a multiple level block diagram, showing a controller, flash dies, and interior details of flash dies.

FIG. 6 is a multiple level block diagram, showing a controller 212, flash dies 222, and interior details of flash dies 222. Diagnostic information relating to the flash memory 206 can be obtained on a per flash package 602, per flash die 222, per flash plane 604, per flash block 606, and/or per flash page 224 basis across the entirety of a storage cluster 160, in some embodiments. In the example shown in FIG. 6, the flash memory 206 includes multiple flash packages 602. Each flash package 602 includes multiple flash dies 222, each of which in turn includes multiple flash planes 604. Each flash plane 604 includes multiple flash blocks 606 each of which in turn includes multiple flash pages 224. The diagnostic information is gathered or generated by the controller 212 of each non-volatile solid-state storage 152 and forwarded to the CPU 156 of the corresponding storage node 150. In some embodiments, the CPU 156 performs further analysis on the diagnostic information and generates further diagnostic information. The controller 212 and/or the CPU 156 can write the diagnostic information to a memory in the storage cluster 160, for example the flash memory 206 or the DRAM 216 of a non-volatile solid-state storage 152, the memory 154 coupled to the CPU 156 in a storage node 150, or other memory of the storage cluster 160, storage node 150, or non-volatile solid-state storage 152. The diagnostic information can be stored as metadata, in some embodiments. The DRAM 216 could be on-chip, e.g. on the controller 212, or off-chip, e.g., separate from and coupled to the controller 212, in various embodiments.

One type of diagnostic information is obtained by tracking bit errors per flash page 224 or per codeword. Each flash page 224 has multiple codewords, in some embodiments. Incidents of error correction could be reported and these incidents may be used as a source on which to base the diagnostic information. For example, the controller 212 could track bit errors of the flash memory 206 and forward the information about the bit errors to the CPU 156, which could then tabulate this and/or generate further diagnostic information. Bit errors, or error corrections, can be tracked from feedback from an error correction block 608 in the controller 212 in some embodiments. The CPU 156 or the controller 212 could track wear of flash blocks 606 in the flash memory 206, e.g., by establishing and updating a wear list in memory coupled as described above, responsive to or based on some of the diagnostic information. Such tracking could include ranking flash blocks 606 as to levels of wear, or comparing flash blocks 606 as to levels of wear. The flash memory 206 can be characterized over time, based on the diagnostic information. Characterization information could indicate changes or trends in the flash memory 206, such as increases in the rate of errors or error correction over time. This characterization can be performed at any of the levels of granularity discussed above.

In some embodiments, the CPU 156 sends the diagnostic information, or summarizes the diagnostic information in a report and sends the report, via a network. The diagnostic information or the report could be sent to an appropriate person or organization, which could include an owner or operator of a storage cluster 160, a manufacturer of storage nodes 150, a manufacturer of flash memory 206, flash packages 602 or flash dies 222 or other interested or authorized party. These reports could benefit the manufacturers, which can use the information for warranty service and/or to highlight manufacturing and reliability problems and guide improvements. The reports also benefit users, who can plan system maintenance, repairs and upgrades based on the details in the reports. Actual behavior of the flash memory 206 over time can be compared to predicted behavior or to warranties if applicable.

The CPU 156 or the controller 212 could make decisions based on the diagnostic information. For example, if it is determined that a flash block 606 has a high level of wear, the CPU 156 or the controller 212 could determine to write some of the user data to another flash block 606 with a lower level of wear. The controller 212 may bias a read from the flash memory, or a write to the flash memory 206, as a response to producing or obtaining the diagnostic information. Depending on the type of flash, and whether specific features are available on flash dies 222, this biasing can take different forms. Biasing the writes or the reads may extend the lifespan of some or all of the flash memory 206. For example, some types of flash dies 222 may support a variable write time, a variable write voltage, a variable read time, a variable reference voltage, a variable reference current or a variable number of reads. The controller 212 could determine, based on the diagnostic information, to direct a flash die 222 to apply a specified value of one of the above variable parameters to a specified write or read. The specified value could be applied to specified writes or reads to flash pages 224, flash blocks 606, flash dies 222, and/or flash packages 602. Thus, the granularity of the application of variable parameters to writes or reads of the flash memory 206 can match and be supported by the granularity of the diagnostic information itself.

Continuing with the above examples, the variable parameters are applicable to multiple scenarios. In a case where a flash block 606 is experiencing an increase in read errors, the controller 212 could direct the flash block 606 to perform repeated reads at differing reference voltages or reference currents. If a variable reference voltage or a reference current is not available, the controller 212 could perform the multiple reads without varying the reference voltage or current. The controller 212, or the CPU 156 could then perform statistical analysis of the reads and determine a most likely bit value for each read of data in the flash block 606. In cases where a variable write parameter is supported in flash dies 222, a value of a variable write parameter can be selected in an attempt to increase write or read reliability of the flash die 222. Similarly, in cases where a variable read parameter is supported in flash dies 222, a value of a variable read parameter can be selected in an attempt to increase read reliability of the flash die 222. In some embodiments a value for a variable write or read parameter could be selected in response to a determination that some portion of flash memory 206 has greater wear relative to another portion. As a further example, some types of flash dies 222 may have and support changing from multilevel cell (MLC) operation to single cell (SLC) operation. SLC flash has one bit per cell, and MLC flash has more than one bit per cell. The CPU 156 or the controller 212 could direct a flash die 222 to change from MLC operation to SLC operation in order to increase reliability of reads or writes. This change may be in response to determining that some portion of the flash memory 206 has greater wear relative to another portion.

Figure 7:
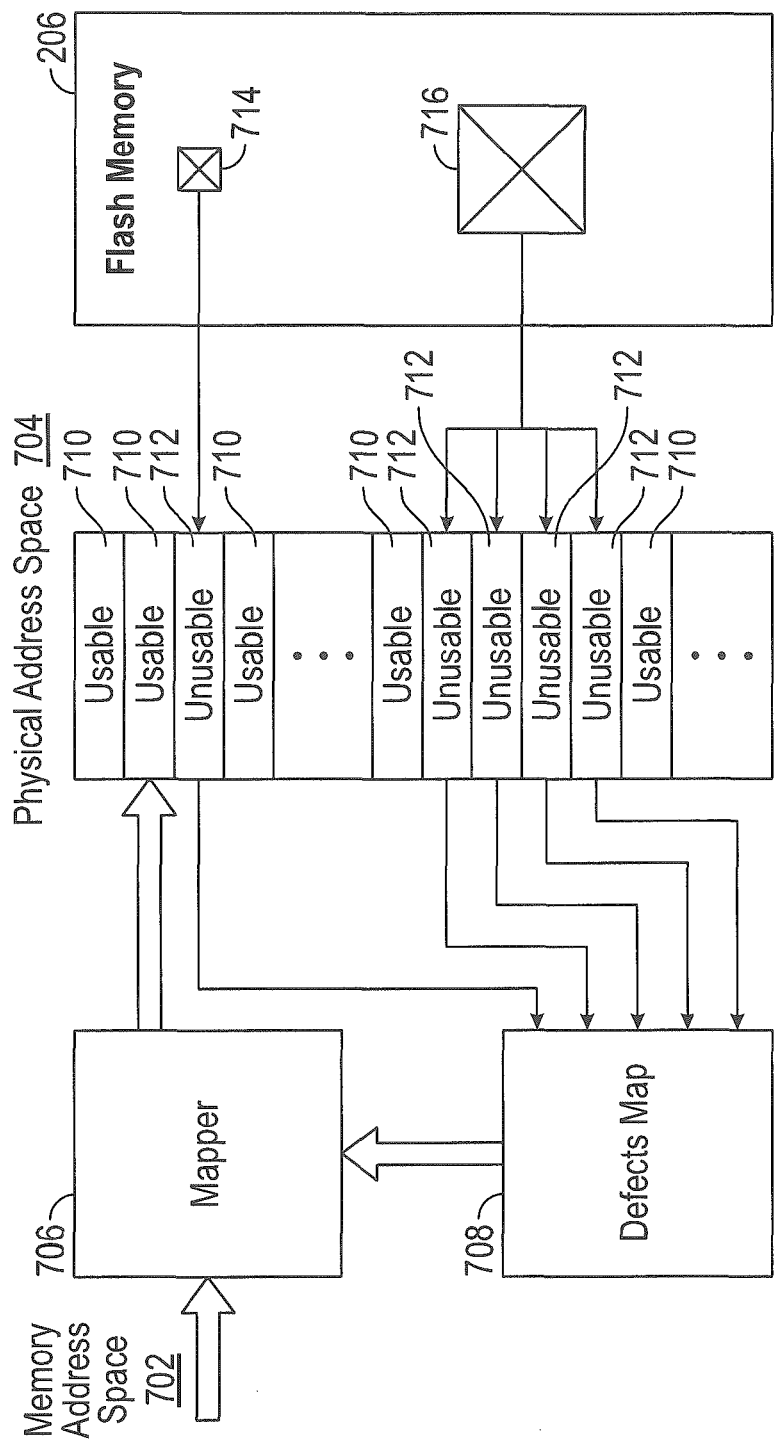
FIG. 7 illustrates failure mapping, in which addresses are mapped around defects in flash memory, in some embodiments.

FIG. 7 illustrates failure mapping, in which addresses are mapped around defects 714, 716 in flash memory 206, in some embodiments. Failure mapping can be applied to known defects and/or newly discovered defects. Application of failure mapping to known defects supports yield recovery by allowing a manufacturer to install flash packages 602 with known defective flash dies 222 into the flash memory 206 of a non-volatile solid-state storage 152 (see FIGS. 3 and 6). Dynamic application of failure mapping to newly discovered defects supports virtualizing the storage capacity of a storage cluster 160, use of all available storage space, and graceful degradation of storage capacity without catastrophic failure. Defects 714, 716 in flash memory 206 can be various sizes and encompass various ranges of addresses in physical address space 704. For example, a relatively small defect 714 could be a single failed bit at a single physical address. A relatively large defect 716 could be a failed flash page, flash block, flash die, or flash package, with a corresponding range of addresses in the physical address space 704. It should be appreciated that the physical address of a defect 714, 716 in the flash memory 206 is related to the physical address of the defect relative to the flash die, the physical address of the flash die relative to the flash package, and the physical address of the contents of the flash package relative to address decoding of flash packages in the flash memory 206 (e.g., address decoding on a printed circuit board and/or address decoding of multiple printed circuit boards relative to the non-volatile solid-state storage unit). Characterization of the defect 714, 716 as small or large is arbitrary and is for illustrative purposes, and further aspects of the defect 714, 716 may be characterized.

Still referring to FIG. 7, in order to perform failure mapping, the non-volatile solid-state storage unit determines which addresses in a physical address space 704 are usable addresses 710, and which addresses in the physical address space 704 are unusable addresses 712. The unusable addresses 712 correspond to locations of the defects 714, 716 in the flash memory 206, and the usable addresses 710 correspond to locations in the flash memory 206 that have working, non-defective flash bits. The usable addresses 710 and unusable addresses 712 are mutually exclusive in some embodiments. That is, the usable addresses 710 in the physical address space 704 exclude the unusable addresses 712 and thus exclude the physical addresses of the defects 714, 716 in the flash memory 206. In some embodiments, the non-volatile solid-state storage 152 generates a defects map 708 that indicates the unusable addresses 712 in the physical address space 704 or otherwise indicates the defects 714, 716 in the flash memory 206. Various formats for the defects map 708, such as a list, an array, a table or a database, are readily devised in accordance with the teachings herein.

A mapper 706 in the non-volatile solid-state storage unit maps memory addresses of a memory address space 702 into physical addresses in the physical address space 704. More specifically, the mapper 706 maps the memory addresses of the memory address space 702 into the usable addresses 710 of the physical address space 704, and thereby maps around or bypasses the unusable addresses 712 and corresponding defects 714, 716 of the flash memory 206. The mapper 706 is thus based on the defects 714, 716, and in some embodiments is based on the defects map 708. The mapper 706 could include one or more of the address translation tables 502 (see FIG. 5), which translate addresses of the user data, at various levels and in various address spaces in the system, to physical memory locations. For example, one embodiment of the non-volatile solid-state storage unit generates an address translation table 502 (e.g., address translation table 502E) that maps around defects 714, 716 in the flash memory 206 on a per flash package 602, flash die 222, flash plane 604, flash block 606, flash page 224 or physical address basis (see FIG. 6). The address translation table 502 is applied to write and read accesses of user data.

There are multiple mechanisms in which a storage node or non-volatile solid-state storage unit could determine the defects 714, 716 in flash memory 206. In embodiments making use of flash dies or flash packages with defects 714, 716 known at the time of assembly of a non-volatile solid-state storage unit, storage node or storage cluster, information could be provided from an external source. The storage nodes could determine the usable addresses 710 and unusable addresses 712 of the flash memory 206 based on information from a manufacturer or tester of flash packages, or flash dies, or a tester of the flash memory 206. This information could be provided via a network in some embodiments. The storage nodes support yield recovery of flash packages that have been downgraded as a result of testing. Downgraded flash packages may have known defects such as a mixture of non-defective flash dies and defective flash dies, or may have flash dies with one or more defective flash blocks or other defective portions of flash memory 206. In embodiments utilizing the dynamic determination of defects 714, 716, the controller of a non-volatile solid-state storage and/or the CPU 156 of a storage node could determine defects 714, 716 as part of or based on the diagnostic information described above with reference to FIG. 6. For example, a threshold could be established for error counts, error rates, error correction counts or error correction rates. When a portion of the flash memory 206 exceeds a total error count, error rate, error correction count or error correction rate, that portion of the flash memory 206 could be declared defective and mapped out as described above. Defect detection, defect mapping, and address translation to map around the defects can be performed on an ongoing basis.

Figure 8:
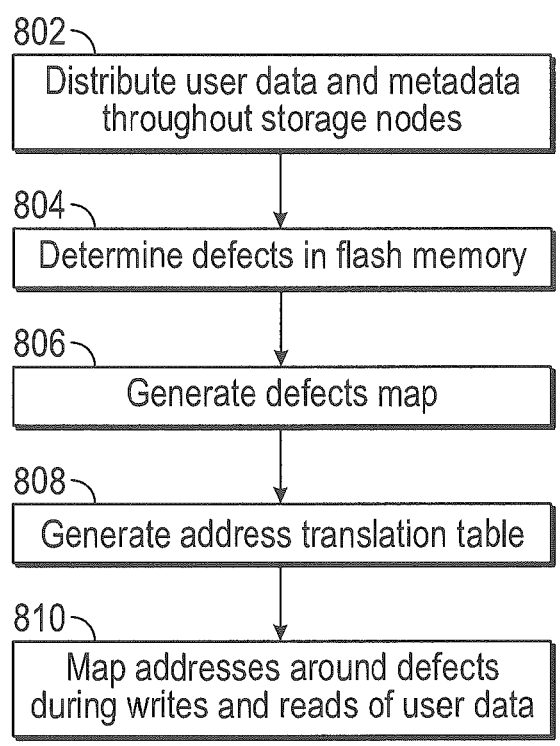
FIG. 8 is a flow diagram of a method for failure mapping in a storage array, which can be practiced on or by the storage cluster, storage nodes and/or non-volatile solid-state storages in accordance with some embodiments.

FIG. 8 is a flow diagram of a method for failure mapping in a storage array, which can be practiced on or by the storage cluster, storage nodes and/or non-volatile solid-state storages in accordance with some embodiments. Some or all of the actions of the method can be practiced by a processor, such as a controller of a non-volatile solid-state storage or a CPU of a storage node. User data and metadata are distributed throughout storage nodes of a storage cluster, in an action 802. The user data is accessible via erasure coding from the storage nodes even if two of the storage nodes are unreachable. Each of the storage nodes has non-volatile solid-state storage with flash memory. The storage nodes may be housed within a single chassis that couples the storage nodes of the storage cluster. Defects in the flash memory are determined, in an action 804. The defects could be determined based on externally provided information such as from a manufacturer or testing. In some embodiments, the defects could be determined based on processes internal to the storage cluster, such as by tracking errors or error corrections and generating diagnostic information.

A defects map is generated, in an action 806. The defects map indicates the defects in the flash memory as determined in the action 804, and could be in a format as discussed above with reference to FIGS. 5-7. An address translation table is generated, in an action 808. The address translation table is based on the defects in the flash memory as determined in the action 804. The address translation table is generated directly in response to determining the defects in some embodiments (in which case the action 806 would not be required) or is generated based on the defects map in further embodiments. The address translation table maps around the defects in the flash memory. Details on generation of the defects map and performing mapping operations as discussed with reference to FIGS. 6 and 7 may be executed here. The addresses are mapped around the defects during writes and reads of user data, in an action 810. This can be accomplished with application of the address translation table and/or the defects map as described with reference to FIG. 7. Some or all of the above actions are repeated in various orders as further defects are determined and as further reads and writes of user data are performed. Generating a defects map and/or an address translation table may include updating a defects map and/or an address translation table, as in generating a defects map as an update of a previous defects map, or generating an address translation table as an update of a previous address translation table. In further embodiments of the method, an initial defects table could be created based upon known defects in the flash memory. New defects could be learned, and the defects table could be updated. The address translation table or tables could then be updated based upon the updates to the defects table.

In some embodiments, because storage capacity is virtualized, there is no practical limit on the number of defect mappings. This mapping can be arbitrarily large, and is expandable. There is no fixed pool or over provisioning for bad block replacement. That is, there is no fixed limit to the number of defects that can be mapped around, and no fixed limit to the expandability of the mapping. Standard solid-state drives, with a fixed pool for defect mapping, are limited on the number of defect mappings.

Figure 9:
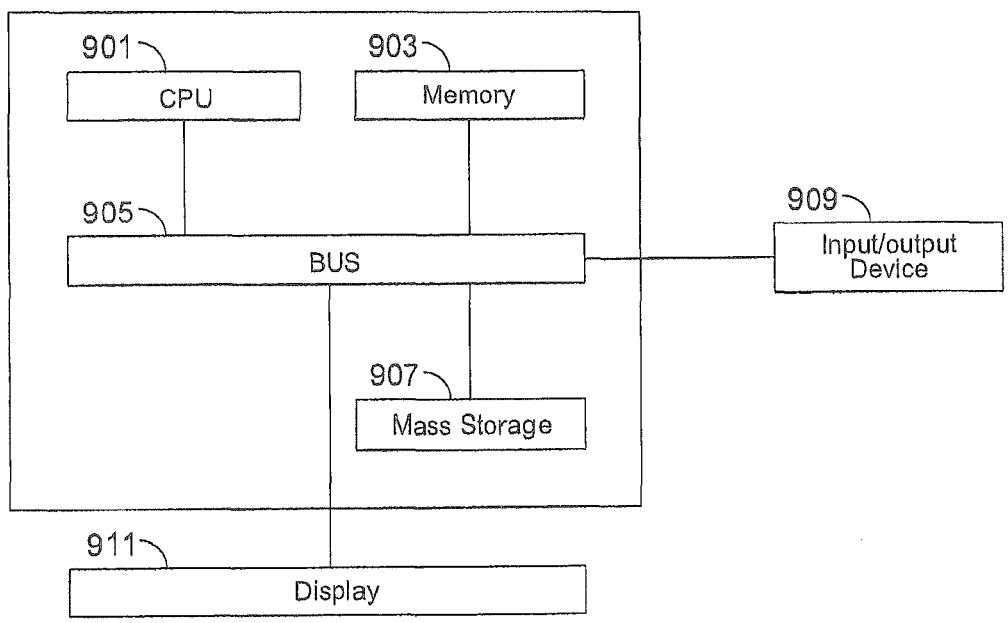
FIG. 9 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 9 is an illustration showing an exemplary computing device which may implement the embodiments described herein. The computing device of FIG. 9 may be used to perform embodiments of the functionality for a storage node or a non-volatile solid-state storage in accordance with some embodiments. The computing device includes a central processing unit (CPU) 901, which is coupled through a bus 905 to a memory 903, and mass storage device 907. Mass storage device 907 represents a persistent data storage device such as a disc drive, which may be local or remote in some embodiments. The mass storage device 907 could implement a backup storage, in some embodiments. Memory 903 may include read only memory, random access memory, etc. Applications resident on the computing device may be stored on or accessed via a computer readable medium such as memory 903 or mass storage device 907 in some embodiments. Applications may also be in the form of modulated electronic signals modulated accessed via a network modem or other network interface of the computing device. It should be appreciated that CPU 901 may be embodied in a general-purpose processor, a special purpose processor, or a specially programmed logic device in some embodiments.

Display 911 is in communication with CPU 901, memory 903, and mass storage device 907, through bus 905. Display 911 is configured to display any visualization tools or reports associated with the system described herein. Input/output device 909 is coupled to bus 905 in order to communicate information in command selections to CPU 901. It should be appreciated that data to and from external devices may be communicated through the input/output device 909. CPU 901 can be defined to execute the functionality described herein to enable the functionality described with reference to FIGS. 1-8. The code embodying this functionality may be stored within memory 903 or mass storage device 907 for execution by a processor such as CPU 901 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method of failure mapping, performed by a storage cluster, the method comprising:

cooperating among one or more processors of storage nodes of a storage cluster and a plurality of controllers of solid-state storage units of the storage cluster to identify defects in solid-state memory of the solid-state storages;

generating a defects map, based on the identified defects;

generating an address translation table that maps around the identified defects in accordance with the defects map;

changing from multilevel cell (MLC) operation to single level cell (SLC) operation of a portion of the solid-state memory of one of the solid-state storages, to increase read reliability of the portion of the solid-state memory of the one of the solid-state storage units; and accessing user data in the storage cluster, in accordance with the address translation table.

2. The method of claim 1, wherein the cooperating to identify the defects comprises:

identifying first defects in the solid-state memory of the solid-state storage units, based on tracking errors or error correction; and identifying second defects in the solid-state memory of the solid-state storage units, based on characterizing the solid-state memory over time.

3. The method of claim 1, wherein the cooperating to identify the defects comprises:

receiving information regarding first defects from a source external to the storage cluster; and determining information regarding second defects based on diagnostic processes internal to the storage cluster.

4. The method of claim 1, wherein the generating the address translation table comprises generating the address translation table that maps around defects on at least two of: a per flash package basis, a per flash die basis, a per flash plane basis, a per flash block basis, a per flash page basis, or a per address basis.

5. The method of claim 1, further comprising:

setting a value of a variable write parameter or a variable read parameter for a portion of the solid-state memory of one of the solid-state storage units, to increase read reliability of the portion of the solid-state memory of the one of the solid-state storage units.

6. The method of claim 1, further comprising:

generating further defects maps, so that each of the solid-state storage units of the storage cluster has a defect map specific to the solid-state memory in respective solid-state storage unit.

7. A tangible, non-transitory, computer-readable media having instructions thereupon which, when executed by a processor or controller, cause the processor or controller to perform a method comprising:

cooperating among processors of storage nodes of a storage cluster and controllers of solid-state storage units of the storage cluster in identifying defects in solid-state memory of the solid-state storage units, the cooperating comprising:

determining first defects, based on defect information from a source external to the storage cluster; and determining second defects, based on at least one diagnostic process that is internal to the storage cluster;

producing a defects map, based on the identifying the defects;

mapping around the identified defects according to the defects map; and accessing user data, through the mapping around the identified defects, in the storage cluster.

8. The computer-readable media of claim 7, wherein the cooperating in the identifying the defects comprises:
tracking errors or error correction; and
characterizing the solid-state memory over time.

9. The computer-readable media of claim 7, wherein the producing the defects map and the mapping around the identified defects are on a basis of at least two of: per flash package, per flash die, or flash plane, per flash block, per flash page, or per address.

10. The computer-readable media of claim 7, wherein the method further comprises:
changing, for a portion of the solid-state memory of one of the solid-state storage units of the storage cluster, from multilevel cell (MLC) operation to single level cell (SLC) operation, responsive to tracking errors or error correction.

11. The computer-readable media of claim 7, wherein the method further comprises:
producing further defects maps, and mapping around further defects according to the further defects maps, throughout the solid-state storage units of the storage cluster, so that each solid-state storage of the storage cluster has at least one defects map.

12. A storage cluster with failure mapping, comprising:
a plurality of storage nodes coupled as a storage cluster, each of the plurality of storage nodes having at least one processor;
a plurality of storage units, each having solid-state memory and at least one controller; and
the processors of the plurality of storage nodes and the controllers of the plurality of storage units configurable to cooperate in a method comprising:
identifying defects in the solid-state memory in the plurality of storage units;
mapping the identified defects;
changing from multilevel cell (MLC) operation of a portion of the solid-state memory to single level cell (SLC) operation, so as to increase read reliability of the portion of the solid-state memory; and
accessing user data through mapping around the identified defects.

13. The storage cluster of claim 12, further comprising:
the processors of the plurality of storage nodes and the controllers of the plurality of storage units configurable to track errors or error correction and characterize the solid-state memory in the plurality of storage units over time, wherein the identifying the defects is based on such tracking and characterizing.

14. The storage cluster of claim 12, further comprising:
the processors of the plurality of storage nodes configurable to receive information from a source external to the storage cluster, regarding first defects of the solid-state memory in the plurality of storage units; and
the controllers of the plurality of storage units configurable to perform diagnostic processes on the solid-state memory in the plurality of storage units, wherein the identifying the defects is based on the information from the source external to the storage cluster and the diagnostic processes.

15. The storage cluster of claim 12, wherein the method further comprises:
generating an address translation table, for each of the plurality of storage units, that maps around the identified defects in the solid-state memory.

16. The storage cluster of claim 12, further comprising:
each of the controllers in the plurality of storage units configurable to set a value of a variable write parameter or a variable read parameter to increase read reliability of a portion of the solid-state memory in the plurality of storage units.

17. The storage cluster of claim 12, wherein the method further comprises:
generating at least one defect map for the solid-state memory of each of the plurality of storage units.

* * * * *